(12) United States Patent
Miyamoto (10) Patent No.: US 6,220,481 B1
(45) Date of Patent: Apr. 24, 2001

(54) SEPARATING FEEDER FOR CHIP COMPONENTS

(75) Inventor: Masayuki Miyamoto, Kyoto (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/235,835

(22) Filed: Jan. 22, 1999

(30) Foreign Application Priority Data

Jan. 27, 1998 (JP) .................................................. 10-029158

(51) Int. Cl.⁷ ........................................................ B23Q 7/12
(52) U.S. Cl. .......................................... 221/167; 221/277
(58) Field of Search .................................... 221/277, 278, 221/217, 156, 167, 266

(56) References Cited

FOREIGN PATENT DOCUMENTS

| 1411951 | 10/1975 | (GB) . |
|---|---|---|
| 1419609 | * 12/1975 | (GB) . |
| 62-28592 | 7/1987 | (JP) . |
| 0837752 | * 6/1981 | (SU) ....................................... 221/277 |

OTHER PUBLICATIONS

Information from Chip Star Inc., Quicksilver 750 "Automatic termination and drying machine for arrays and other chip components," 13 pages, parts of which are dated Jun. 16, 1997.

* cited by examiner

Primary Examiner—Kenneth W. Noland
(74) Attorney, Agent, or Firm—Burns, Doane, Swecker & Mathis, LLP

(57) ABSTRACT

A chip component feeder which has high feeding efficiency feeds chip components individually in stable orientations. The separating feeder of the present invention includes a scattering disk disposed so that the top surface thereof is inclined with respect to a horizontal plane, a transferring groove formed on the scattering disk and a cavity formed at an outer peripheral end portion of the scattering disk. When the scattering disk is rotated, chip components are dropped into the transferring groove and are aligned in a predetermined direction. After the chip components are accommodated in the cavity by gravitational force (i.e., by upward rotation of the transferring groove), separation of the chip component in the cavity from the chip components in the transferring groove can be achieved.

17 Claims, 7 Drawing Sheets

SEPARATING FEEDER FOR CHIP COMPONENTS

This application corresponds to Japanese Patent Application No. 10-29158, filed Jan. 27, 1998 which is incorporated in its entirety by reference herein.

BACKGROUND OF THE INVENTION

1. Field of the Invention

The present invention relates generally to a chip feeding system and, more particularly, to a system and method for separating chip components, such as electronic chip components, to thereby allow for individual feeding of the components.

2. Description of the Related Art

A separating feeder having substantially increased capacity for feeding chip components over that of an oscillating ball feeder or a linear feeder has been disclosed in, for example, Japanese Examined Utility Model Publication No. 62-28592. In this separating feeder, a rotating inner disk and an outer disk, which intermittently rotates along the outer periphery of the inner disk, are disposed at a slant to a horizontal plane. The outer disk has an annular trough comprised of a plurality of fitting holes for aligning chip components. The annular trough is disposed at the same level as the end of the inner disk.

The inner disk and the outer disk are rotated in opposite directions to each other. As a result of the rotation of the inner and outer disks, the chip components are individually separated by dropping through the fitting holes. While this process efficiently separates circular disk-shaped chip components, rectangular-shaped chip components fall less effectively through the fitting holes, which decreases feeding efficiency. When small size chip components (e.g., chip components having a size of approximately 1 mm) are provided, orientation of the chip components dropped into the fitting holes may be unstable, since the fitting hole size should also be small in size. This results in a reduction of reliability.

SUMMARY OF THE INVENTION

Accordingly, it is an object of the present invention to provide a system and method for individually and efficiently separating chip components irrespective of chip component size and shape.

In order to achieve the above-mentioned object, an exemplary embodiment of the present invention provides a separating feeder for chip components which comprises: a scattering disk disposed such that the top surface thereof is inclined with respect to a horizontal plane; driving means for rotational driving the scattering disk; a transferring groove formed on the scattering disk extending outward, which aligns the chip components; and a cavity formed at an outer peripheral end portion of the transferring groove in which one chip component is held, wherein chip components are individually fed by holding the one chip component in the cavity.

A number of chip components are dumped on the scattering disk and accumulate in the bottom portion thereof since the top surface of the scattering disk is inclined. When the scattering disk is rotated, some of the chip components drop into the transferring grooves and are simultaneously aligned in a predetermined direction. Since the transferring grooves are formed so as to extend outward on the scattering disk, the probability of chip components dropping into the transferring grooves is greater than into the fitting holes of the conventional system. The chip components dropped into the transferring grooves slide toward the outer end peripheral portion of the transferring grooves toward the cavities as a result of the rotation of the scattering disk. Each cavity is formed of such a shape so as to allow it to receive and hold a single chip component. Thereafter the scattering disk is rotated so as to allow the chip components in the transferring grooves to slide downward toward the center of the disk, leaving only the chip component which has been received by the cavity. Chip components are then individually separated from the cavity at a predetermined location.

The shape of the transferring groove is not limited to radial shapes, but can be spiral, helical, etc. It is preferable that a number of grooves be formed on the scattering disk which extend in an outward direction. When rectangular-shaped chip components are fed, the width of the transferring groove is longer than the narrower edge of the chip component and smaller than the longer edge of the chip component to be able to longitudinally align the chip components.

According to exemplary embodiments of the present invention, the cavity may be formed in a stepped hole-shape at the outer peripheral end portion of the transferring groove or in a concave-shape in the circumferential direction (i.e., the trailing side of the rotation) at the outer peripheral end portion of the transferring groove. Other cavity shapes are also possible so long as the cavity is capable of receiving and holding a single chip component in such a manner so as to prevent the component from sliding downward toward the center of the disk.

The separating feeder of the present invention further comprises a rotatable outer-guide, disposed in the peripheral portion of the scattering disk, for preventing chip components on the scattering disk from dropping outside (e.g., from being ejected). It is preferable that the outer-guide be placed at least at the bottom (e.g., lower) portion of the scattering disk (and extend an arc of, e.g., over 180°). The rotatable outer-guide is unnecessary during those situations when a peripheral wall is disposed in the outer peripheral end portion of the scattering disk.

The separating feeder of the present invention further comprises an air-blowing nozzle disposed at the outer-guide for forcing chip components in the transferring groove, except for the chip component in the cavity, towards the center of the scattering disk. The air-blowing nozzle may be useful in those situations where chip components do not slide toward the scattering disk center (e.g., due to the angle of inclination of the scattering disk). The blown air provides the necessary momentum in such a situation to force the chip components to slide downward. As a result, smooth separation of the chip components is provided.

The separating feeder of the present invention may further comprise a guide ring disposed on the top surface of the scattering disk which forms a gate entrance for allowing only the chip components aligned in the transferring groove to move in the outward peripheral direction of the scattering disk. There is a concern that the chip components dumped on the scattering disk may be damaged by sliding along the outer guide, etc. The guide ring eliminates the sliding motion of chip components, thereby preventing damage to the chip components. By placing the gate entrance at the end of the transferring groove to prevent a plurality of chip components from being accumulated adjacent to the cavity, dispensing of the chip components can be improved.

The separating feeder of the present invention may further comprise an inner-ring disposed on the top surface of the scattering disk, forming an annular space for accommodating a number of chip components between the inner-ring and the guide ring. When the chip components dumped on the scattering disk are rotated in an upward direction, the chip components drop toward the center of the scattering disk. By restraining the fall of the chip components through the use of the inner ring, the chip components in the transferring groove can be rotated while retaining them in the groove.

The separating feeder of the present invention may further comprise an airblowing nozzle disposed at the inner-ring for urging chip components in the transferring groove in the direction of the outer diameter. When chip components cannot smoothly slide toward the outer peripheral end portion of the transferring groove due to friction between the transferring groove and the chip components, the chip components can be smoothly sent by a blast of blowing air.

The separating feeder of the present invention may further comprise an airsuction port disposed at the cavity of the scattering disk for holding a chip component within the cavity. In this case, the chip components in the cavity can be prevented from falling out of the cavity due to, for example, suction force.

BRIEF DESCRIPTION OF THE DRAWINGS

The foregoing, and other, objects, features and advantages of the present invention will be more readily understood upon reading the following detailed description in conjunction with the drawings in which.

DESCRIPTION OF THE PREFERRED EMBODIMENTS

Figure 6:
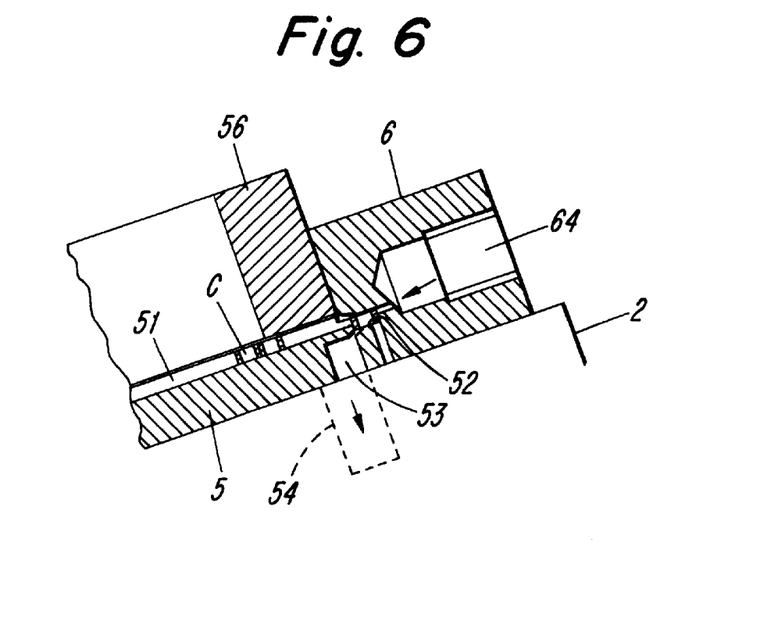
FIG. 6 is an enlarged sectional view at the line VI—VI of FIG. 2.
Figure 7:
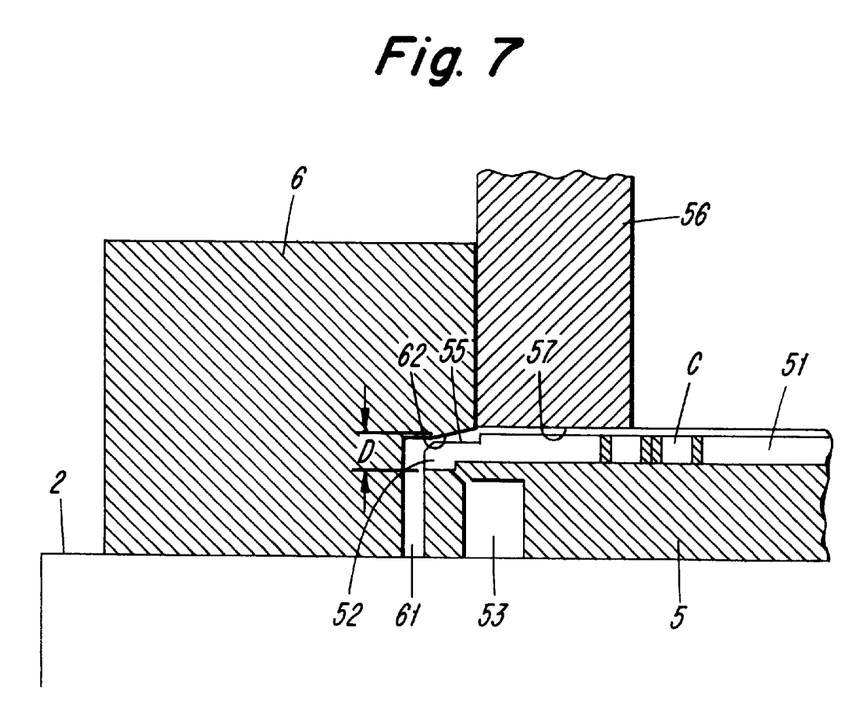
FIG. 7 is a fragmentary enlarged sectional view of FIG. 1.
Figures 8, 9:
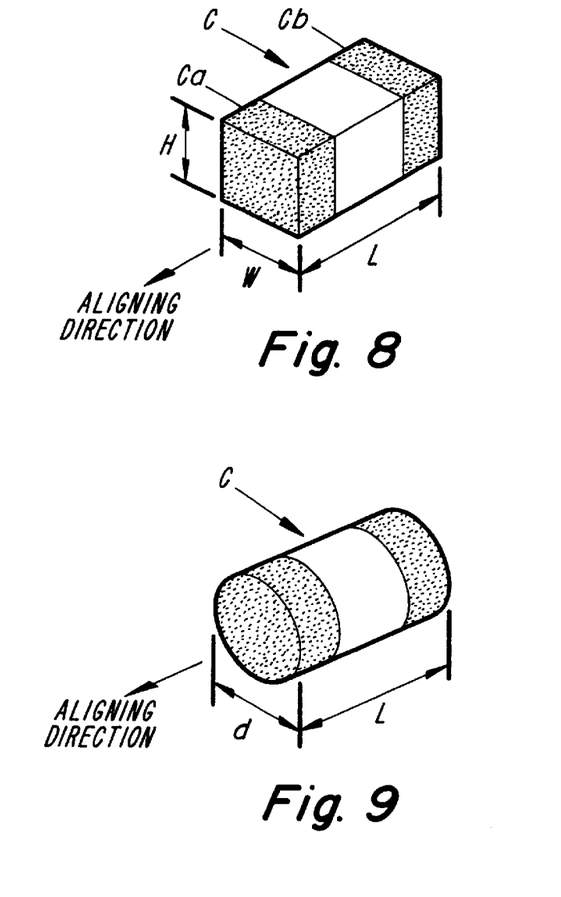
FIG. 8 is a perspective view of one example of a chip component.
FIG. 9 is a perspective view of another example of a chip component.

FIGS. 1 to 10 show an embodiment of a separating feeder for chip components according to the present invention. According to this embodiment, the chip component for feeding is a rectangular-shaped electronic chip component as shown in FIG. 8, in which the height and the width are H and W (where H≅W), respectively, and the length is L (where L>H and L>W). Electrodes Ca and Cb are formed on both end surfaces of the chip component C in the longitudinal direction.

Figure 1:
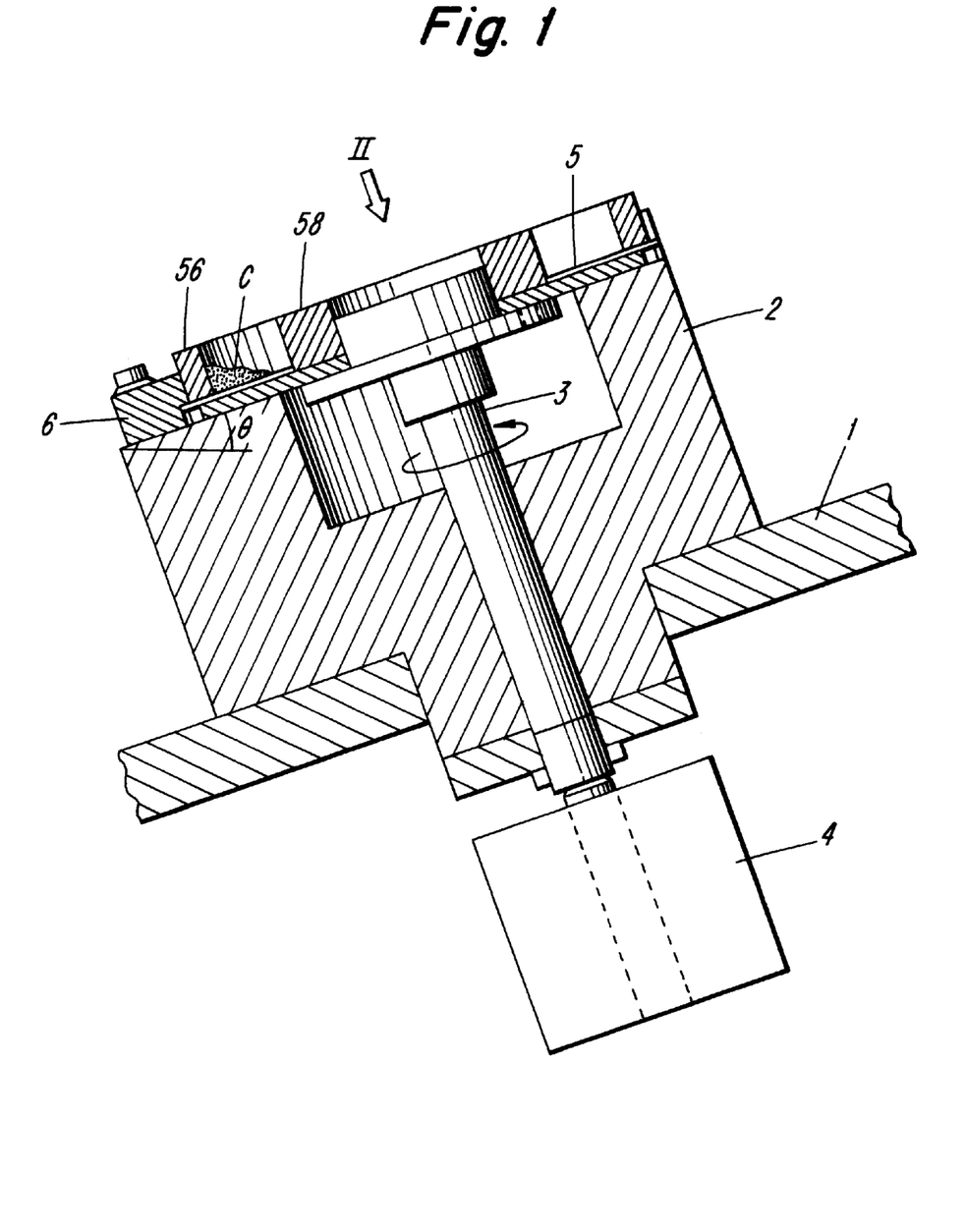
FIG. 1 is an overall sectional view of a separating feeder for chip components according to an embodiment of the present invention.
Figure 2:
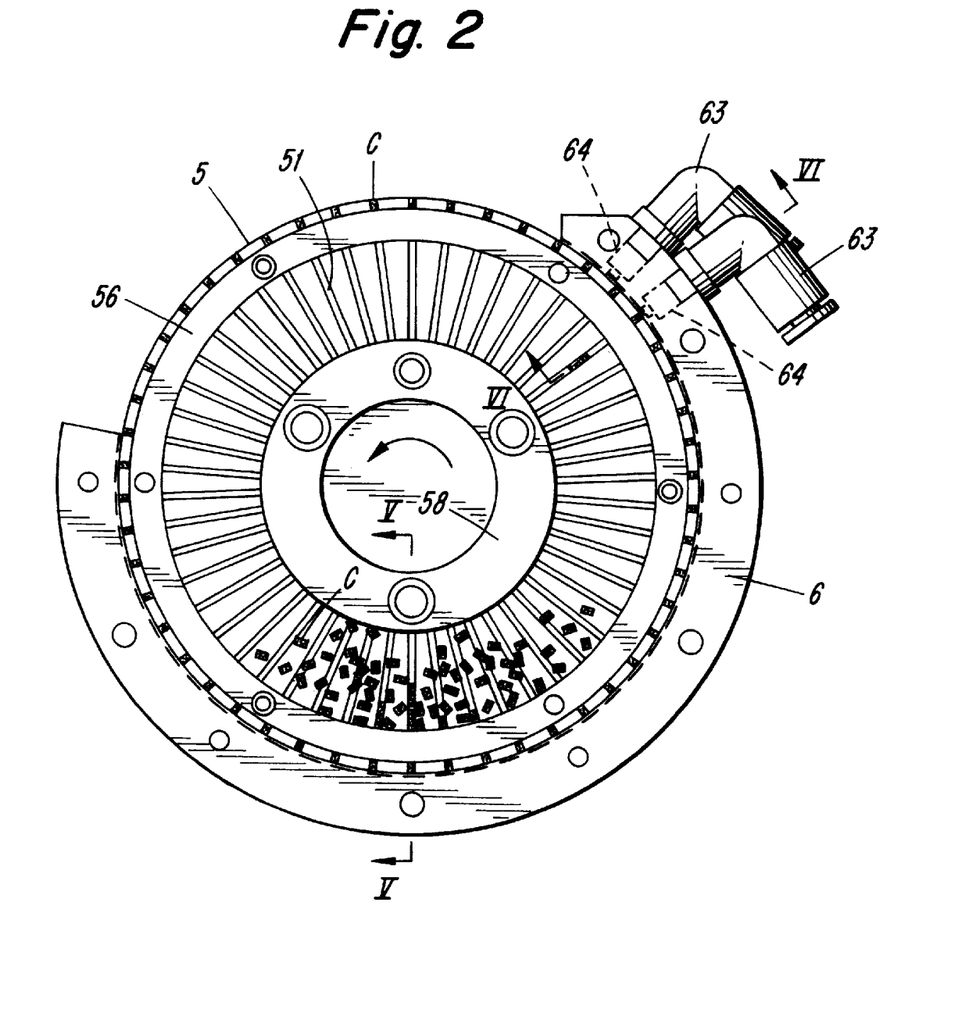
FIG. 2 is a plane view of a separating feeder for chip components viewed in the direction of arrow II of FIG. 1.

The separating feeder, as shown in FIGS. 1 and 2, includes a table 1 disposed at a slant, a base 2 fixed on the table 1, a driving shaft 3 inserted into the center of the base 2, a motor 4 driving the driving shaft 3, a scattering disk 5 connected to the end of the driving shaft 3 sliding over the top surface of the base 2, and an outer guide 6 fixed on the top surface of the base 2 surrounding a portion of the outer periphery of the scattering disk 5.

According to an embodiment of the present invention, the scattering disk 5 is rotated counterclockwise, as shown by the arrow of FIG. 2, and the driving of the scattering disk 5 may be either continuous or intermittent. One skilled in the art will appreciate that, as an alternative, the scattering disk may be rotated clockwise.

Figure 3:
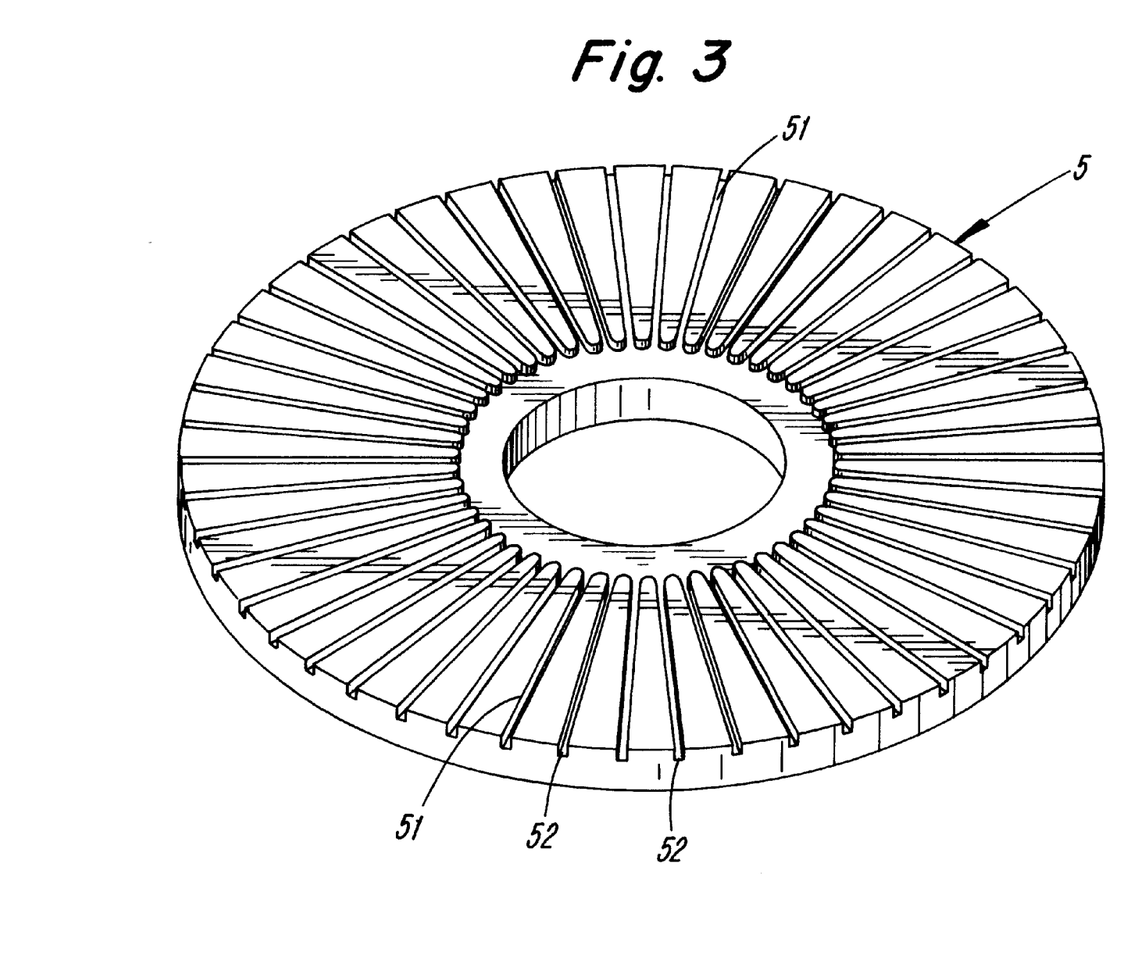
FIG. 3 is a perspective view of a scattering disk.

The scattering disk 5 is placed at a slant of a predetermined angle of inclination θ (0°<θ<90°) with respect to a horizontal plane. On the top surface of the scattering disk 5, a number of transferring grooves 51 are formed, as shown in FIG. 3, radially extending from the inner diameter portion to the outer periphery. The width and depth of each transferring groove 51 are preferably longer than the narrow edges H and W of the chip component but are smaller than the longer edge L. As a result, when a number of chip components C are dumped on the rotating scattering disk 5, the chip components fall into the transferring grooves 51 by gravitational force and are aligned in the longitudinal direction.

Figure 4:
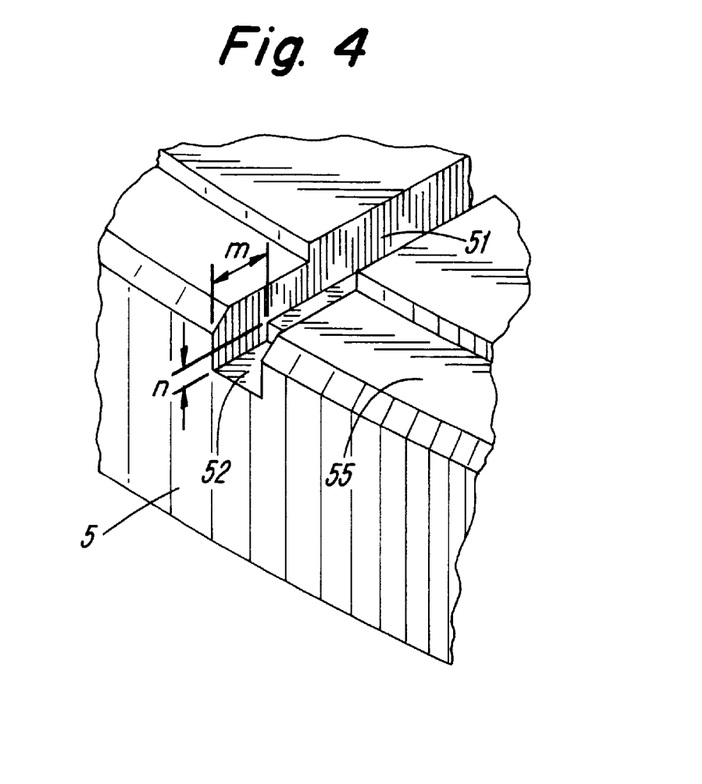
FIG. 4 is an enlarged perspective view of an outer peripheral end portion of the scattering disk.
Figure 5:
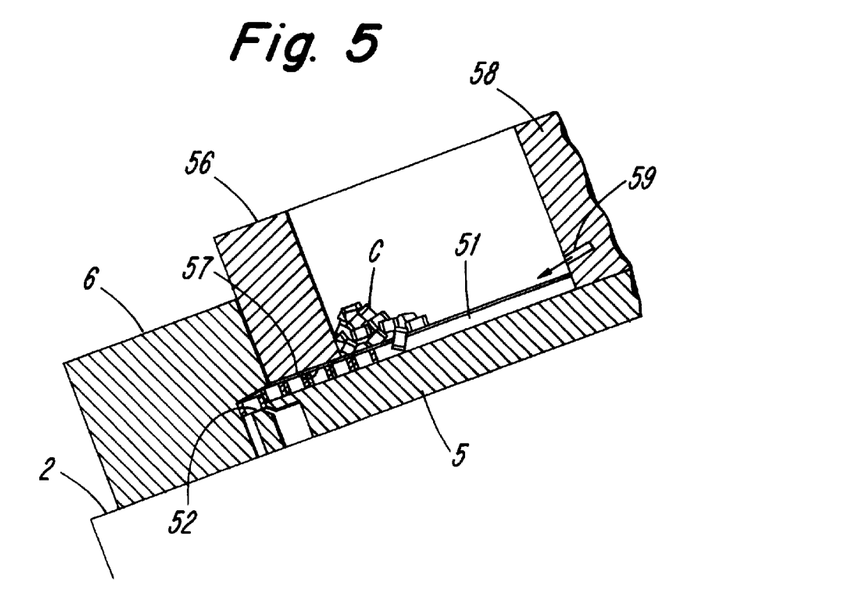
FIG. 5 is an enlarged sectional view at the line V—V of FIG. 2.

At the outer peripheral end portion of the transferring groove 51, as shown in FIG. 4, a stepped hole-shaped cavity 52, capable of holding one chip component C, is formed. If the length m in the radial direction of the cavity 52 is smaller than the longer edge L of the chip component C, a portion of the chip component dropped into the cavity 52 protrudes outward in the outer periphery of the scattering disk 5. Since the difference in bottom level n between the cavity 52 and the transferring groove 51 is smaller than the narrow edge W of the chip component C, a subsequent chip component C, which is transferred down the transferring groove 51 toward to the cavity 52, will be prevented from entering the cavity due to the presence of a chip component in the cavity (see FIG. 5).

At the inner peripheral portion of the cavity 52, an air suction port 53 which is connected to a vacuum source 54, is formed. Accordingly, the chip component C accommodated in the cavity 52 is held under suction to the inner peripheral portion of the cavity 52 and is prevented from being blown off by a blowing force of air from an airblowing nozzle 64, which will be described in more detail below. On the outer peripheral top surface of the scattering disk 5, a stepped concave portion 55 is formed in an annular shape (see FIG. 4).

Over the outer peripheral top surface of the scattering disk 5, a guide ring 56 forming a gate entrance 57, is fixed which allows only the chip components C aligned in the transferring grooves 51 to move outward on the scattering disk 5. Over the top surface of the scattering disk 5 in the edge of the inner end of the transferring groves 51, an inner ring 58 is fixed. Between the inner ring 58 and the guide ring 56, an annular space for accommodating a number of chip components C is formed on the top surface of the scattering disk 5.

In the inner ring 58, a plurality of air blowing nozzles 59 (see FIG. 5) are formed at even intervals. Blowing air from the air blowing nozzles 59, which is directed downward, urges the chip components C remaining in the transferring grooves 51 so that they slide downward (i.e., in the outer radial direction).

The guide ring 56 provides the following advantages. The outer guide 6, fixed to the base 2, has a speed relative to the chip components C on the rotating scattering disk 5 on the surface facing the chip components C. If the structure is such that those chip components C which are not aligned in the transferring grooves 51 of the scattering disk 5 directly touch the outer guide 6, then when the chip components touch the outer guide 6, an external force from a random direction is exerted on the chip components depending on conditions (e.g., orientation) of the chip components C. When the rotation of the scattering disk 5 is set at a high speed or when small chip components are supplied, the external force is substantially greater than the force of the weight of the chip component C itself and is not negligible in terms of its impact on the quality of chip components C. In order to reduce damage to chip components C, a guide ring 56 is provided which rotates in unison with the scattering disk 5.

Another function of the guide ring 56 is to form the gate entrance 57 which allows only the chip components C aligned in the transferring grooves 51 to move outward on the scattering disk 5 without becoming disarranged. For example, when a chip component C rising up in a transferring groove 51 slides toward the cavity 52, the chip component C is blocked by the inner edge of the gate entrance 57. The chip components aligned in the transferring grooves 51, therefore, face the outer guide 6 in constant orientations, and both edges of the chip components C are guided, as well, by the side surfaces of the transferring grooves 51. This minimizes the external force exerted on the chip components C without holding them in the cavity 52 in abnormal orientations.

In order to prevent chip components C, which are sliding in the transferring grooves 51, from falling out of the scattering disk 5, the outer guide 6, as shown in FIG. 7, is disposed with a preferable clearance 61 so as to surround a portion of the outer periphery of the scattering disk 5. As illustrated, the outer guide 6 also surrounds the bottom half of the periphery. In this embodiment, the outer guide 6 surrounds a portion of the outer periphery of the scattering disk 5 over an angle of approximately 240°. At the inner peripheral portion of the outer guide 6, a tapered guide surface 62 is formed in accordance with the stepped concave portion 55 of the scattering disk 5 to thereby enable the chip components C to reach the outer peripheral end portion of the transferring grooves 51 and to smoothly enter the cavity 52.

In order to prevent a chip component C accommodated in the cavity 52 from meshing with another chip component C, the difference D in the bottom level between the cavity 52 and the guide surface 62 follows the relationship below $W < D < 2W$ where W is defined as the narrow edge length of a chip component C.

In the vicinity of the top portion of the circular arc-shaped outer guide 6, as shown in FIG. 2, nozzles 63 are provided in order to blow air for aiding the separation of chip components C. In this embodiment, two nozzles 63 are connected. To the end of the nozzle 63, as shown in FIG. 6, an air-blowing nozzle 64, directed toward the inner diameter portion of the scattering disk, is connected. By the blowing air injected from the air-blowing nozzle 64, the chip components C in the transferring grooves 51, other than those in the cavity 52 are urged to move in the direction of the inner diameter portion (i.e., downwardly). Accordingly, the chip components C which cannot slide downwardly by their own weight are forced to slide downwardly so as to enable separation of chip components from the chip component in the cavity 52. When the scattering disk 5 is rotated at high speed, the centrifugal force exerted on the chip components C in the transferring grooves 51 is large; therefore, it is difficult to move the chip components C back to the inner diameter portion by only their weight. By jetting the separating air as described above, the chip components C can be individually separated at a high speed of rotation. A plurality of the air-blowing nozzles 64 along the periphery, as in this embodiment, are effective in improving reliability in separation.

The separating air-blowing also provides the following functions:

1) Moving the chip component back, which fails to be accommodated in the cavity 52, toward the scattering disk 5, when chip components are scattered onto the scattering disk 5; and
2) Scraping away the chip component, which is transferred to the upper portion of the scattering disk 5 by the rotation of the scattering disk 5, while not entering into the transferring groove 51, from the scattering disk 5. It is preferable that a smaller clearance than the chip component C be formed between the guide ring 56 and the scattering disk 5 to improve this function.

The operation of the separating feeder according to the aforementioned embodiment is now described. A number of chip components are dumped on the top surface of the rotating scattering disk 5, especially on the accommodating space surrounded by the inner ring 58 and the guide ring 56. Since the top surface of the scattering disk 5 is inclined, chip components C are accumulated in the bottom portion of the scattering disk 5 by gravitational force. Some of the accumulated chip components fall into the transferring grooves 51 to be aligned. The chip components dropped into the transferring grooves 51 slide downward by gravitational force. Only one chip component C at the leading edge is accommodated in the cavity 52. Due to a stirring effect and to the rotation of the scattering disk 5, those chip components C which did not initially drop into the transferring grooves 51 because of their orientations gradually come to drop into the transferring grooves 51.

When the transferring grooves 51 containing chip components C are rotated upward, the chip components C slide downward along the transferring grooves 51 by gravitational force, leaving only the chip component which has been received in the cavity 52. There may be chip components C which do not slide downward due to the angle of inclination θ of the scattering disk 5. The separating blown-air jetted from the air-blowing nozzle 64 forces these chip components C to move back on the scattering disk 5. Since the chip component C within the cavity 52 is retained by the suction of the air suction port 53, the chip component is prevented from dropping out of the cavity 52 when the separating blown-air is jetted.

The individual chip components which are separated in each of the cavities 52 are transferred to the upper portion of the scattering disk 5 with the rotation of the scattering disk 5. The chip component C is unprotected at a dispensing portion, that is, the location where the outer guide 6 does not exist. At this place, the chip components C are individually dispensed from the cavity 52 by a dispensing device (not shown) to be conveyed to subsequent processing apparatus (e.g., apparatus which uses the components in an assembly operation).

As described above, by forming a number of transferring grooves 51 on the scattering disk 5, the capacity of the feeder is increased over that of a conventional feeder (for example, Japanese Examined Utility Model Publication No. 62-28592). For example, when fifty transferring grooves 51 are formed on the scattering disk 5, which is rotated at 60 rpm, the capacity may be up to 3000 units per minute, achieving a high performance separating feeder.

The above-mentioned embodiment has been described using a rectangular-shaped chip component C as an example in which the width W and the height H are nearly equal and the length L is large. The above-mentioned separating feeder, however, may also align cylindrical-shaped chip components C in which, as shown in FIG. 9, the diameter is d (d≅W, H), and the length is L (L>d). Moreover, the present invention also allows for circular disk-shaped chip components C, in which the diameter d is the same as the length L or the diameter d is larger than the length L, to be aligned.

Figure 10A:
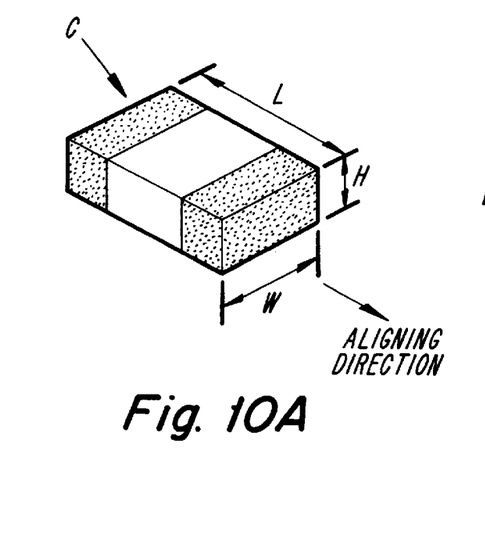
FIGS. 10A and 10B are perspective views of another exemplary chip component.
Figure 10B:
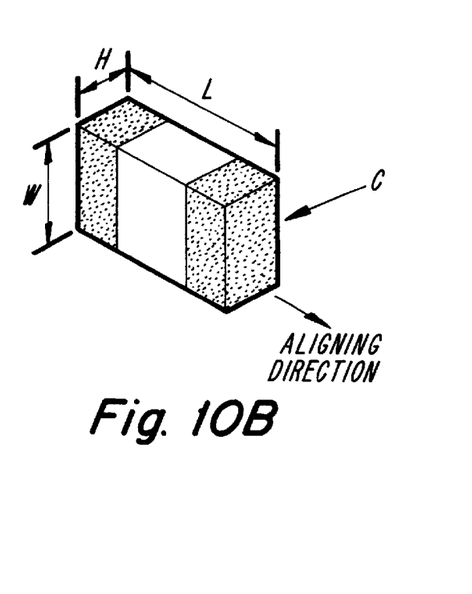

Rectangular-shaped chip components C, as shown in FIGS. 10A and 10B, in which the width W differs from the height H (L>W>H), can also be aligned. In this case, when the width of the transferring grooves 51 is larger than W and smaller than L and the height of the gate entrance 57 is formed so as to be larger than H and smaller than W, chip components C can be passed through the gate entrance 57 if the width W is transverse to the aligning direction, as shown in FIG. 10A. If the height of the gate entrance 57 is larger than W and smaller than L, chip components C can be passed through the gate entrance 57 even when the width W is vertical, as shown in FIG. 10B, and not only when the width W is transverse to the aligning direction, as shown in FIG. 10A. One skilled in the art will appreciate that other chip component shapes are also possible. For example, cubic-shaped chip components in which W, H, and L are substantially equal can also be aligned.

Figure 11:
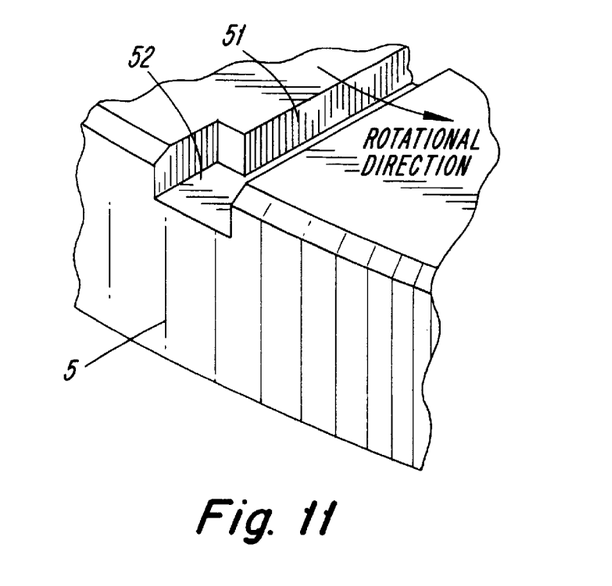
FIG. 11 is a perspective view of an exemplary cavity.

In the above-mentioned embodiment, at the outer peripheral end portion of the transferring groove 51, the stepped hole-shaped cavity 52 is formed. A concave-shaped cavity 52, however, as shown in FIG. 11, may alternatively be formed in the circumferential direction (i.e., trailing side of the rotation) at the outer peripheral end portion of the transferring groove 51. In this case, by sliding with the outer guide 6 or by gravitational force, only one chip component C can be accommodated in the cavity 52.

Figure 12:
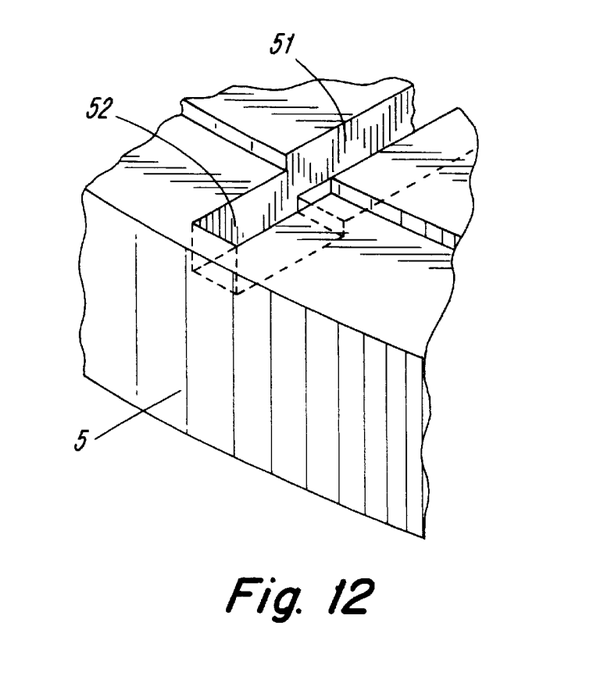
FIG. 12 is a perspective view of another exemplary cavity.

One skilled in the art will appreciate that the cavity 52 is not limited to a shape which is open in the outer peripheral end portion. The cavity may be of a form which is closed in the outer peripheral end portion, as shown in FIG. 12. In such a case, the outer guide 6 can be eliminated since the dropping off of chip components C accommodated in the cavity 52 in the outer diameter direction is prevented.

It is to be understood that the present invention is not limited to the above-mentioned embodiments. For example, in the above-mentioned embodiments, rectangular, cubic, and cylindrical-shaped chip components are described, but other forms of chip components, such as circular disk-shaped chip components, can also be fed. Accordingly, shapes of the transferring groove and the cavity may be changed according to the shape of the chip component. Further, the shape of the transferring groove is not limited to linear radial shape, but may be spiral or helical or some other shape, as long as the groove continuously extends outward.

As is understood from the above description, a separating feeder for chip components is provided, according to the present invention, which comprises a scattering disk, disposed such that the top surface thereof is inclined with respect to a horizontal plane. The feeder has transferring grooves and cavities formed thereon. With the rotation of the scattering disk, chip components are dropped into the transferring groove to be aligned in a predetermined direction. After the chip components are accommodated in the cavity by gravitational force (i.e., by upward rotation of the transferring groove), separation of the chip component in the cavity from the chip components in the transferring groove can be achieved. As a result, feeding efficiency is improved compared with a conventional feeder in which island-shaped fitting holes are used for separating chip components. The present invention allows for efficient separation of chip components irrespective of chip component size and shape.

The foregoing has described the principles, preferred embodiments and modes of operation of the present invention. However, the invention should not be construed as being limited to the particular embodiments discussed above. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A separating feeder for chip components, comprising:
   a scattering disk which is inclined with respect to a horizontal plane;
   driving means for rotationally driving said scattering disk;
   at least one transferring groove formed on said scattering disk and extending toward an outer periphery of said disk, wherein said at least one transferring groove aligns the chip components when the chips components are disposed therein; and
   a cavity, which is associated with said at least one transferring groove and formed at an outer peripheral end portion thereof, for holding one chip component;
   wherein a bottom surface of said cavity is recessed with respect to a bottom surface of said groove;
   wherein chip components are separated by selectively holding the one chip component in said cavity.

2. A separating feeder according to claim 1, further comprising an outer-guide disposed at a peripheral portion of said scattering disk for preventing chip components on said scattering disk from being ejected from said scattering disk.

3. A separating feeder according to claim 2, further comprising an air-blowing nozzle disposed at a peripheral portion of said scattering disk for urging chip components in said transferring groove, except for the one chip component in said cavity, in a radially inward direction.

4. A separating feeder according to claim 1, further comprising a guide ring disposed on a top surface of said scattering disk forming a gate entrance, wherein only components which are aligned in a predetermined orientation in said groove are allowed to pass through said entrance.

5. A separating feeder according to claim 4, further comprising an inner-ring disposed on the top surface of said scattering disk, said guide ring and said inner-ring forming an annular space for accommodating a number of chip components between said inner-ring and said guide ring.

6. A separating feeder according to claim 5, further comprising an air-blowing nozzle disposed at said inner-ring for urging chip components in said transferring groove in a radially outward direction.

7. A separating feeder according to claim 1, further comprising an air-suction port disposed at said cavity of said scattering disk for holding a chip component in said cavity.

8. A separating feeder according to claim 1, wherein said scattering disk includes a plurality of transferring grooves having cavities at their respective radially distal ends.

9. A separating feeder according to claim 1, wherein said cavity is closed off at its radially distal end.

10. A separating feeder according to claim 1, wherein said transferring groove radially extends from an inner diameter of said scattering disk to an outer diameter of said scattering disk.

11. A separating feeder for chip components, comprising:

a scattering disk which is inclined with respect to a horizontal plane:

driving means for rotationally driving said scattering disk:

at least one transferring groove formed on said scattering disk and extending toward an outer periphery of said disk, wherein said at least one transferring groove aligns the chip components when the chips components are disposed therein; and a cavity, which is associated with said at least one transferring groove and formed at an outer peripheral end portion thereof, for holding one chip component;

wherein said cavity has a concave extension in the direction of the circumference of said scattering disk;

wherein chip components are separated by selectively holding the one chip component in said cavity.

12. A method for separating chip components in a separating feeder comprising a scattering disk which is inclined with respect to a horizontal plane, at least one transferring groove which is formed on said scattering disk and extends in a radially outward direction and a cavity which is formed at an outer peripheral end portion of said at least one transferring groove, said method comprising the steps of:

dropping chip components on said scattering disk;

rotating said scattering disk;

aligning, as a result of said rotating step, chip components within said at least one transferring groove;

receiving one chip component from said at least one transferring groove into said cavity; and holding, with said cavity, said one chip component;

wherein other chip components are separated from said one chip component held in said cavity.

13. The method according to claim 12, wherein said other chip components are separated from said one chip by air-blowing said other chip components in a direction away from said cavity.

14. The method according to claim 12, wherein said one chip is held in said cavity by air suction.

15. The method according to claim 12, further comprising the step of:

providing an outer-guide which is disposed in a peripheral portion of said scattering disk for preventing chip components on said scattering disk from being ejected from said scattering disk.

16. The method according to claim 12, further comprising the step of:

providing a gate entrance for allowing only chip components aligned in said at least one transferring groove in a predetermined orientation to move in an outward peripheral direction on said scattering disk, and said step of receiving comprises receiving chip components through said gate entrance.

17. The method according to claim 12, further comprising the step of:

urging chip components in the at least one transferring groove to move in a radially outward direction by blowing air on said components.

* * * * *